United States Patent
Hsu et al.

(10) Patent No.: US 7,682,048 B2
(45) Date of Patent: Mar. 23, 2010

(54) LIGHTING EMITTING DIODE LAMP

(75) Inventors: Hung-Kuang Hsu, Miao-Li Hsien (TW); Chun-Wei Wang, Miao-Li Hsien (TW); Wen-Jang Jiang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 0 days.

(21) Appl. No.: 12/040,828

(22) Filed: Feb. 29, 2008

(65) Prior Publication Data
US 2009/0161354 A1    Jun. 25, 2009

(30) Foreign Application Priority Data
Dec. 21, 2007  (CN) .................. 2007 1 0203294

(51) Int. Cl.
*F21V 29/00* (2006.01)

(52) U.S. Cl. .................. 362/294; 362/547; 362/264; 362/231

(58) Field of Classification Search .................. 362/580, 362/547, 218, 264, 294, 373, 293, 231, 230, 362/510, 2
See application file for complete search history.

(56) References Cited

U.S. PATENT DOCUMENTS

| | | | | |
|---|---|---|---|---|
| 6,517,221 B1 * | 2/2003 | Xie | ............................. | 362/373 |
| 6,641,284 B2 * | 11/2003 | Stopa et al. | .................. | 362/240 |
| 7,004,602 B2 * | 2/2006 | Waters | ....................... | 362/242 |
| 7,005,679 B2 * | 2/2006 | Tarsa et al. | ..................... | 257/89 |
| 7,384,151 B2 * | 6/2008 | Seki | ............................ | 353/52 |
| 2005/0047170 A1 * | 3/2005 | Hilburger et al. | ........... | 362/547 |
| 2007/0258244 A1 * | 11/2007 | Curran et al. | ............... | 362/311 |
| 2008/0144329 A1 * | 6/2008 | Okuda | ........................ | 362/539 |
| 2009/0059582 A1 * | 3/2009 | Kulkarni | ..................... | 362/234 |

OTHER PUBLICATIONS

Michael S. Shur et al., Solid-State Lighting: Toward Superior Illumination, Proceedings of the IEEE, vol. 93, No. 10, Oct. 2005.

* cited by examiner

*Primary Examiner*—Jacob Y Choi
(74) *Attorney, Agent, or Firm*—Andrew C. Cheng

(57) ABSTRACT

A lighting emitting diode (LED) lamp (100) includes a first LED array (60) and a second LED array (50). A rate of change of a relatively luminous intensity relative to the temperature of the first LED array is lower than that of the second LED array. A first heat sink (10) thermally attaches to the first LED array. A second heat sink (20) thermally attaches to the second LED array. A heat dissipation efficiency of the second heat sink is higher than that of the first heat sink. The heat dissipation of the second LED array is much quicker than that of the first LED array. The second LED array thus can be kept working at a much lower temperature.

17 Claims, 4 Drawing Sheets

LIGHTING EMITTING DIODE LAMP

CROSS-REFERENCE TO RELATED APPLICATION

This application is related to a co-pending application entitled a same title with the present application, assigned to the same assignee of this application and filed on the same date. The disclosure of the co-pending application is wholly incorporated herein by reference.

BACKGROUND OF THE INVENTION

1. Field of the Invention

The present invention relates generally to a light emitting diode lamp, and particularly to a heat dissipation device of the lamp.

2. Description of Related Art

In recent years, light emitting diodes (LEDs), because of being highly efficient light sources, have come to be widely used in such fields as automotive transport, display screens, and traffic control indicators.

It is well known that LEDs emit light within a relatively narrow-band spectrum. Therefore, LEDs are inherently suited as sources of colored light, whereas many applications require white light with a broad spectrum. Two basic approaches for producing white light rely on either partial or complete conversion of short-wave radiation from LED chips or using a variety of independently controlled primary colored LEDs. During operation, when the variety of colored LEDs give off light, heat is also produced, and thus the working temperature of the LEDs increases. However, rates of change of the luminous intensity of the variety of colored LEDs relative to their respective working temperature are much different from each other. For example, the luminous intensity of the red LEDs, the yellow LEDs or the orange LEDs decreases much more than that of the blue LEDs for equal increases in working temperature. Color, luminance, and color temperature of the white light thus are much affected by change of the red LEDs. Therefore a heat dissipation device is needed to keep the variety of colored LEDs working at different suitable working temperatures.

Therefore, a heat dissipation device for the LED lamp is desired to overcome the above describe shortcomings.

SUMMARY OF THE INVENTION

In accordance with the present embodiment, a light emitting diode (LED) lamp includes a circuit board, first and second LED arrays electrically connected with and thermally attached to one side of the circuit board, and first and second heat sinks thermally attached to an opposite side of the circuit board. A ratio of change of luminous intensity relative to change of temperature of the first LED array is less than that of the second LED array. The first heat sink includes a first base thermally attached to the first LED array, and a plurality of first fins extending from the first base. The second heat sink includes a second base thermally attached to the second LED array, and a plurality of second fins extending from the second base. A heat dissipation efficiency of the second heat sink is greater than that of the first heat sink.

Other advantages and novel features of the present invention will be drawn from the following detailed description of a preferred embodiment of the present invention with attached drawings, in which:

DETAILED DESCRIPTION OF THE INVENTION

Figure 1:
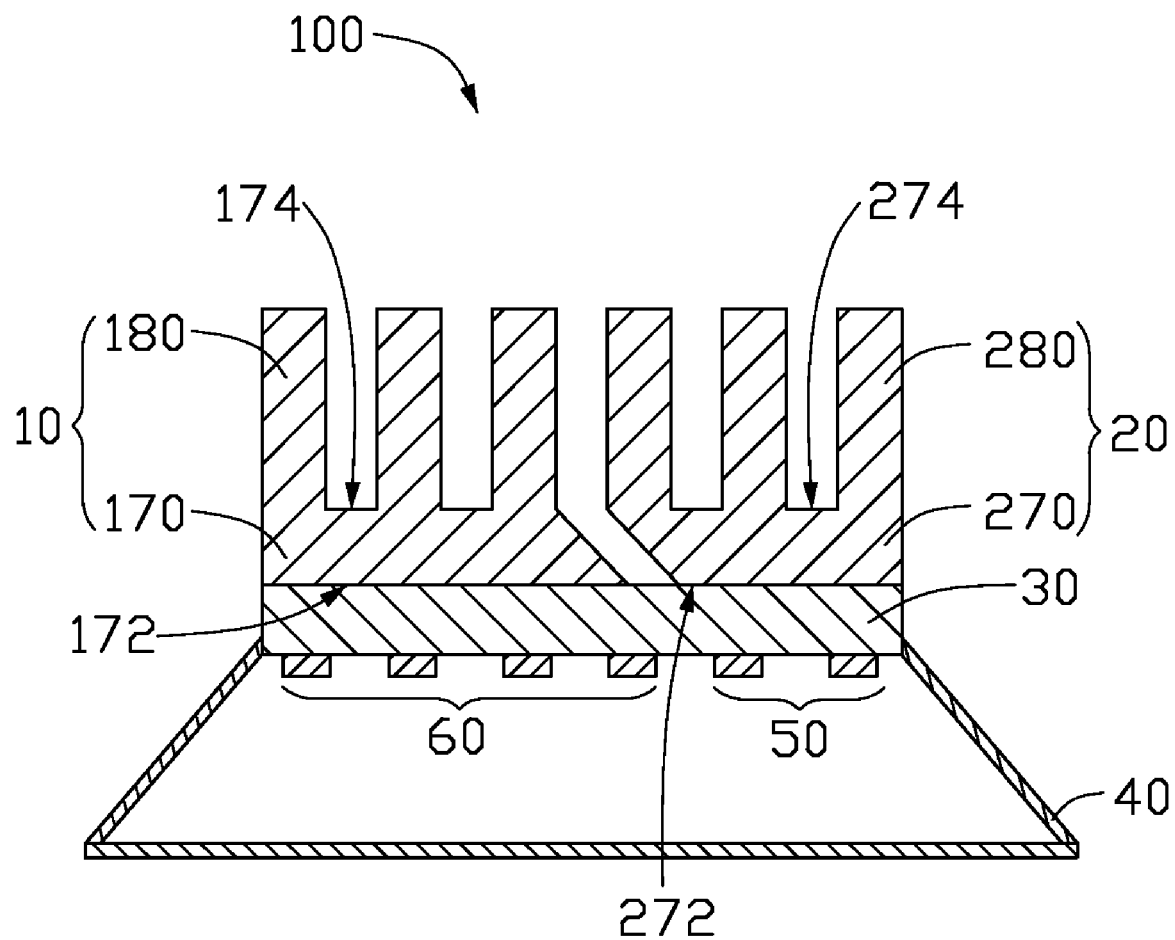
FIG. 1 is an assembled, cross-sectional view of a light emitting diode (LED) lamp of a present embodiment of the present invention.

The detailed explanation of a light emitting diode (LED) lamp 100 according to the present invention will now be made with reference to the drawings attached hereto. Referring to FIG. 1, the LED lamp 100 includes a substrate 30, a light source arranged on the substrate 30, a heat dissipation device, and a reflecting shell 40.

In this embodiment, the substrate 30 is a metal core printed circuit board (MCPCB). A plurality of circuits (not shown), are printed on the substrate 30 for electrically connecting the light source thereon. The MCPCB is usually made of aluminum, which has a much larger heat conductivity coefficient to enhance the heat transfer efficiency between the light source and the substrate 30. It is to be understand that the substrate 30 is not limited to be MCPCB, a conventional PCB or a ceramic PCB is also can be adopted. The light source includes a plurality of LEDs being electrically connected with the circuitry of the substrate 30 through wire bonding or flip chip. The reflecting shell 40 is mounted around the light source.

In this embodiment, the light source includes two LED arrays 50, 60. The LED array 60 emits blue light and is made of GaInN or GaN, with a wavelength in a range of 450~470 nm. The LED array 50 emits red light and is made of AlInGaP or GaAs, with a wavelength in a range of 610~635 nm. A plurality of yellow phosphor particles are arranged outside each blue LED chip of the blue LED array 60. A part of the blue light emitted by the blue LED chip is absorbed by the phosphor particles and is converted to yellow light. The remaining part of the blue light mixes with the yellow light and is perceived as white light. The red LED chip radiates red light, which mixes with the white light to improve a color-rendering index of the white light.

Figure 2:
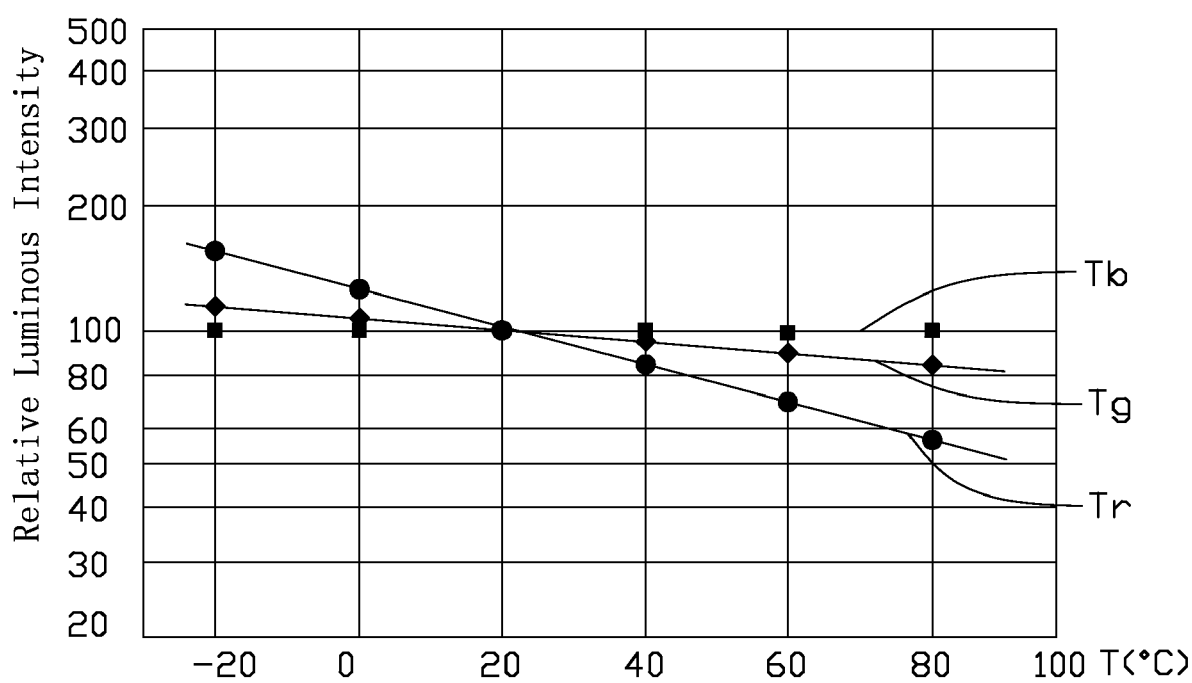
FIG. 2 is a graph indicating a relationship of a relative luminous intensity of different colored LEDs and working temperature thereof.

FIG. 2 shows a relationship of relative luminous intensity of different colored LEDs and working temperature thereof. Lines Tb, Tg, and Tr respectively show change in relative luminous intensity of a blue LED, a green LED, and a red LED according to the working temperature. When the working temperature increases to 80° C., the relative luminous intensity of the blue LED is substantially constant, and the relative luminous intensity of the green LED only decreases by about 15%. However, as the working temperature increases to 80° C., the relative luminous intensity of the red LED decreases by about 45%, whereas, if the working temperature does not exceed 40° C., decrease in the relative luminous intensity of the red LED is not higher than 15%. Thus the working temperature of the red LED should be kept much less than that of the blue LED or the green LED, which is also suitable for yellow and orange LEDs.

The heat dissipation device is thermally attached to the substrate 30 to dissipate the heat of the LED arrays 50, 60. In this embodiment, the heat dissipation device includes a first fin-type heat sink 10 arranged to cool the blue LED array 60, and a second fin-type heat sink 20 arranged to cool the red LED array 50. The heat sinks 10, 20 are extruded aluminum heat sinks, respectively including a base 170, 270 and a plurality of fins 180, 280. The base 170, 270 respectively includes a bottom surface 172, 272 thermally attached to the substrate 30 and an opposite top surface 174, 274. The fins 180, 280 extend upwardly from the top surface 174, 274. The difference between the two heat sinks 10, 20 is that a cross sectional area of the base 170 of the first heat sink 10 gradually decreases from the bottom surface 172 to the top surface 174 thereof, whilst a cross sectional area of the base 270 of the second heat sink 20 gradually increases from the bottom surface 272 to the top surface 274 thereof. Thus a density of the fins 280 of the second heat sink 20 relative to the bottom surface 272 thereof which thermally attaches to the red LED array 50 is greater than that of the first heat sink 10. A heat dissipation efficiency of the second heat sink 20 is thus greater than that of the first heat sink 10. As the first heat sink 10 is arranged on the blue LED array 60, and the second heat sink 20 is arranged on the red LED array 50, the heat dissipation of the red LED array 50 is much quicker than that of the blue LED array 60. The red LED array 50 can thus be kept at a much lower working temperature.

Figure 3:
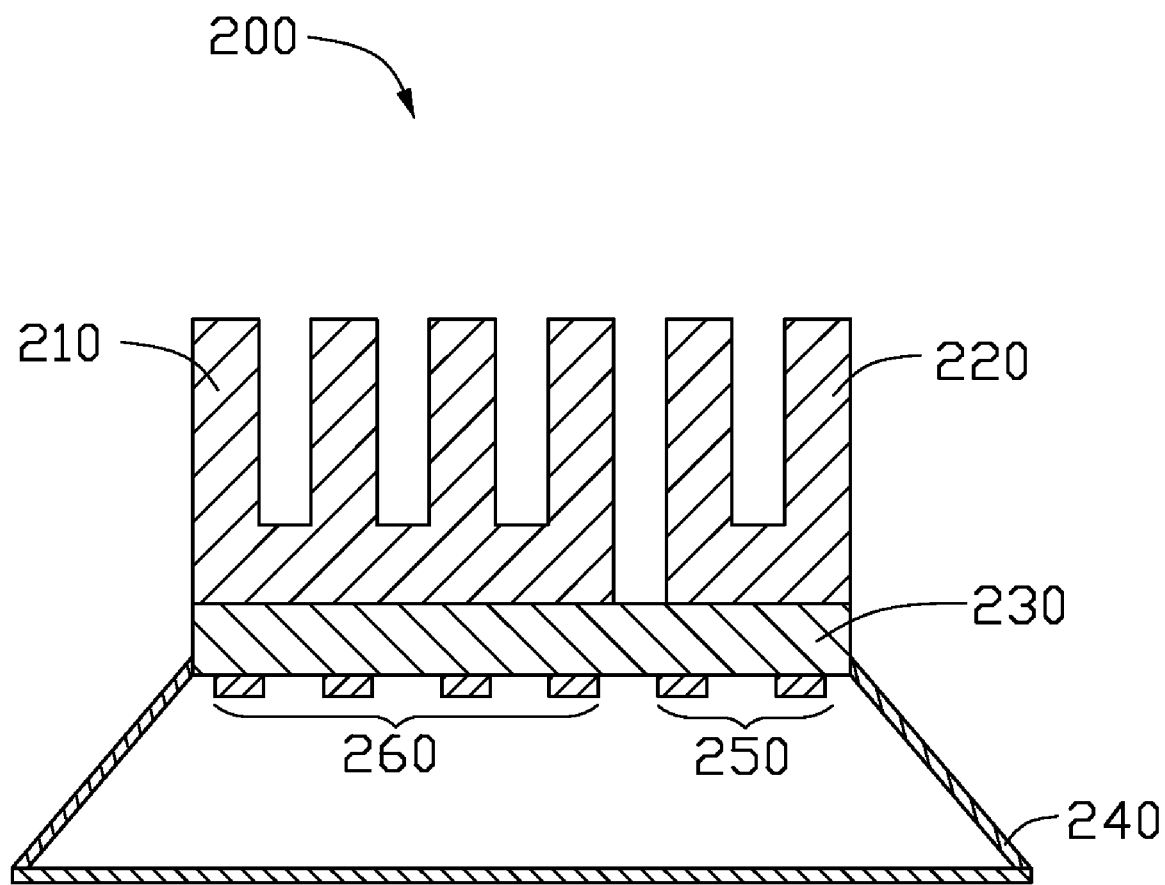
FIG. 3 is similar to FIG. 1, but shows an alternative embodiment of the LED lamp.

FIG. 3 shows an alternative embodiment of the present invention. The LED lamp 200 according to this embodiment has a light source adopting a blue LED array 260 and a red LED array 250 to obtain white light. A reflecting shell 240 is mounted around the light source. The blue LED array 260 and the red LED array 250 are electrically connected with and thermally attached to a substrate 230. The first heat sink 210 is arranged on the substrate 230 to cool the blue LED array 260, and the second heat sink 220 is arranged on the substrate 230 to cool the red LED array 250. The difference between this embodiment and the first embodiment is that materials of the two heat sinks 210, 220 are different from each other. The two heat sinks 210, 220 are made of highly thermally conductive material, such as copper, aluminum, or their alloys. In this embodiment, the first heat sink 210 is made of aluminum, and the second heat sink 220 is made of copper. A heat conductivity coefficient of copper is approximately 1.8 times that of aluminum. Thus heat dissipation efficiency of the second heat sink 220 is greater than that of the first heat sink 210. The heat dissipation of the red LED array 250 is much quicker than that of the blue LED array 260. The red LED array 250 can thus be kept at a much less working temperature.

Figure 4:
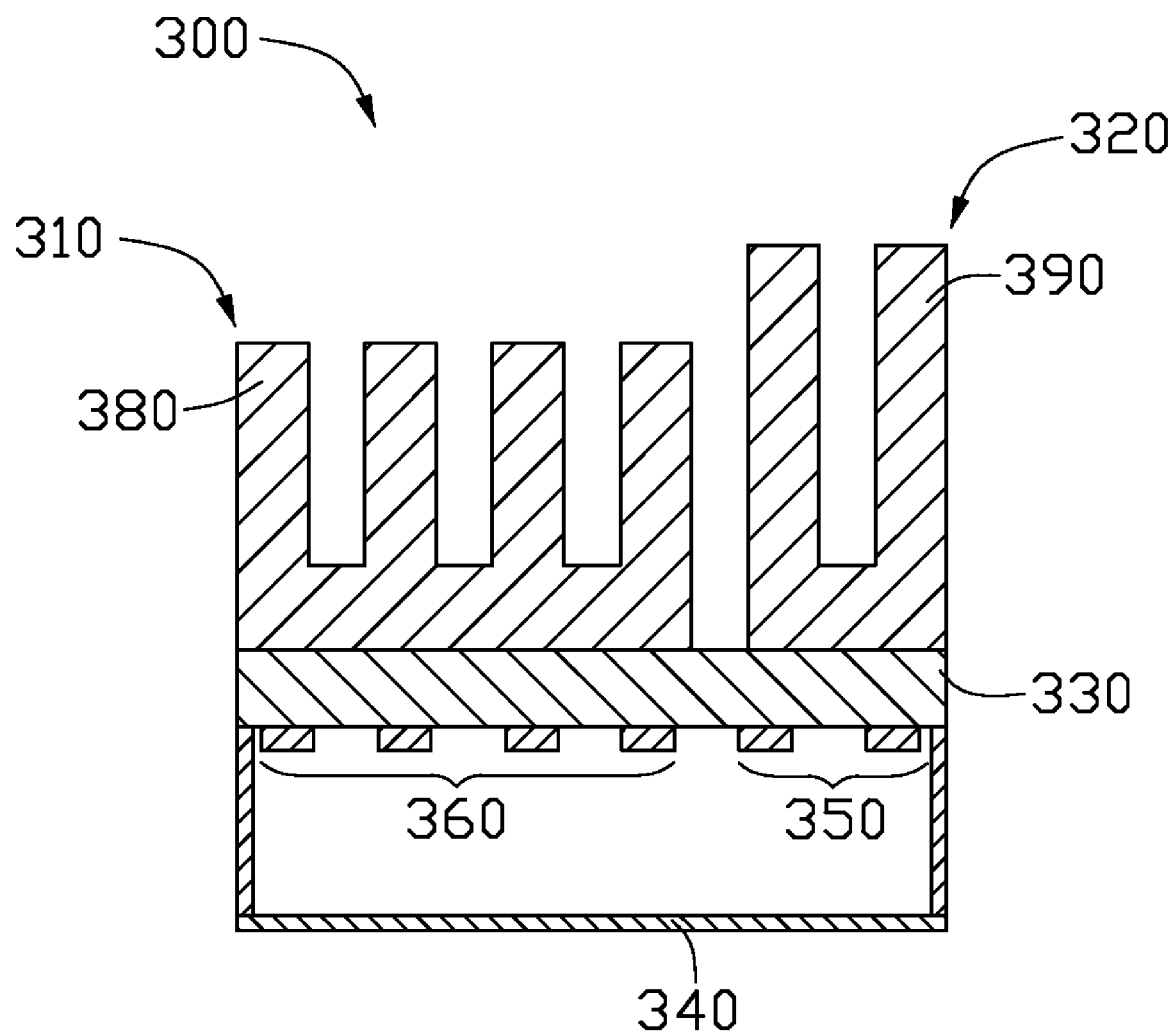
FIG. 4 shows the LED lamp according to a third embodiment of the present invention.

Referring to FIG. 4, an LED lamp 300 according to a third embodiment is shown. The light source of the LED lamp 300 has LEDs in four different colors, which include a plurality of blue LEDs, green LEDs, yellow LEDs and red LEDs. The different colored LEDs are electrically connected with and thermally attached to a substrate 330. A dispersion shell 340 is mounted around the LEDs to mix the light radiated by the different colored LEDs to produce white light. The blue LEDs and the green LEDs form a first LED array 360, and the yellow LEDs and the red LEDs form a second LED array 350. A first heat sink 310 is arranged on the substrate 330 to cool the first LED array 360, and a second heat sink 320 is arranged on the substrate 330 to cool the second LED array 350. Each of the heat sinks 310, 320 has a plurality of fins 380, 390. The difference between the two heat sinks 310, 320 is that a length of the fins 380 of the first heat sink 310 is less than that of the fins 390 of the second heat sink 320. Thus the heat dissipation area of each fin 390 of the second heat sink 320 is greater than that of the first heat sink 310. The heat dissipation efficiency of the second heat sink 320 is greater than that of the first heat sink 310. The heat dissipation of the second LED array 350 is much quicker than that of the first LED array 360. The red LEDs and the yellow LEDs can thus be kept at a much less working temperature. Apparently, the fins are used for increasing the heat dissipation area of the heat sink. Alternatively, the fins can be pin shaped. The fins and the base can be formed separately, and then connected together by soldering.

It can be understood that the above-described embodiment are intended to illustrate rather than limit the invention. Variations may be made to the embodiments and methods without departing from the spirit of the invention. Accordingly, it is appropriate that the appended claims be construed broadly and in a manner consistent with the scope of the invention.

What is claimed is:

1. A light emitting diode lamp, comprising:
   a circuit board which has a first surface and a second surface at opposite sides thereof, the first surface facing a first direction, the second surface facing a second direction substantially opposite to the first direction;
   a first light emitting diode array and a second light emitting diode array being arranged on the first surface of the circuit board in a juxtaposed manner, the first and second light emitting diode arrays electrically connected with and thermally attached to the first surface of the circuit board,
   a ratio of change of luminous intensity relative to change of temperature of the first light emitting diode array being less than that of the second light emitting diode array;
   a first heat sink thermally attached to the second surface of the circuit board and positioned corresponding to the first light emitting diode array; and
   a second heat sink thermally attached to the second surface of the circuit board and positioned corresponding to the second light emitting diode array, the first and second heat sinks being juxtaposed at the second surface of the circuit board, a heat dissipation efficiency of the second heat sink being greater than that of the first heat sink.

2. The light emitting diode lamp of claim 1, wherein the first heat sink is made of aluminum, and a material of the second heat sink has a heat conductivity coefficient greater than that of aluminum.

3. The light emitting diode lamp of claim 1, wherein each heat sink comprises a base having a contacting surface thermally attached to the corresponding light emitting diode array and an opposite surface, and a plurality of fins extending from the opposite surface of the base, a cross sectional area of the base of the first heat sink gradually decreasing from the contacting surface to the opposite surface, a cross sectional area of the base of the second heat sink gradually increasing from the contacting surface to the opposite surface.

4. The light emitting diode lamp of claim 1, wherein each heat sink comprises a base thermally attached to the corresponding light emitting diode array and a plurality of fins extending from the base, and a length of the fins of the second heat sink is greater than that of the fins of the first heat sink.

5. The light emitting diode lamp of claim 1, wherein the circuit board is a metal core printed circuit board.

6. The light emitting diode lamp of claim 1, wherein the first light emitting diode array includes at least one blue light emitting diode for emitting blue light, and the second light emitting diode array includes at least one red light emitting diode for emitting red light.

7. The light emitting diode lamp of claim 6, further comprising a reflecting shell mounted around the first and second light emitting diode arrays, and a plurality of yellow phosphor particles arranged outside each blue LED chip to convert blue light of the blue light emitting diode to yellow light, the yellow light mixed with the blue light and red light to produce white light.

8. The light emitting diode lamp of claim 1, wherein the first light emitting diode array includes at least one blue light emitting diode and at least one green light emitting diode, and the second light emitting diode array includes at least one red light emitting diode and at least one yellow light emitting diode.

9. The light emitting diode lamp of claim 8, further comprising a dispersion shell mounted around the first and second light emitting arrays to mix the light emitted from the different colored light emitting diodes to produce white light.

10. A light emitting diode lamp, comprising:
a circuit board which has a first side and an opposite second side, the first and second sides facing away from each other;
first and second light emitting diode arrays electrically connected with and thermally attached to the first side of the circuit board, the first and second light emitting diode arrays being arranged on the first side of the circuit board in a juxtaposed manner, a ratio of change of luminous intensity relative to change of temperature of the first light emitting diode array being less than that of the second light emitting diode array;
first and second heat sinks thermally attached to the second side of the circuit board, the first and second heat sinks being juxtaposed at the second side of the circuit board and positioned corresponding to the first and second light emitting diode array, respectively, the first heat sink comprising a first base thermally attached to the first light emitting diode array and a plurality of first fins extending from the first base, the second heat sink comprising a second base thermally attached to the second light emitting diode array and a plurality of second fins extending from the second base, a heat dissipation efficiency of the second heat sink being greater than that of the first heat sink.

11. The light emitting diode lamp of claim 10, wherein the first base has a cross sectional area gradually decreasing along an extending direction of the first fins, and the second base has a cross sectional area gradually increasing along a extending direction of the second fins.

12. The light emitting diode lamp of claim 10, wherein the second fins have a length greater than that of the first fins.

13. The light emitting diode lamp of claim 10, wherein the second heat sink is made of copper, and the first heat sink is made of aluminum.

14. A light emitting diode lamp, comprising:
a circuit board which has a first side and an opposite second side, the first and second sides facing opposite directions;
first and second light emitting diodes electrically connected with and thermally attached to the first side of the circuit board, the first light emitting diodes being arranged in a group, the second light emitting diodes being arranged in a group, the two groups of light emitting diodes being arranged on the first side of the circuit board in a juxtaposed manner, a ratio of change of luminous intensity relative to change of temperature of the first light emitting diodes being less than that of the second light emitting diodes;
first and second heat sinks thermally attached to the second side of the circuit board, the first and second heat sinks being juxtaposed at the second side of the circuit board and located corresponding to the two groups of light emitting diodes, respectively, the first heat sink comprising a first base thermally attached to the first light emitting diodes and a plurality of first fins extending from the first base, the second heat sink comprising a second base thermally attached to the second light emitting diodes and a plurality of second fins extending from the second base, a heat dissipation efficiency of the second heat sink being greater than that of the first heat sink.

15. The light emitting diode lamp of claim 14, wherein the first base has a cross sectional area gradually decreasing along an extending direction of the first fins, and the second base has a cross sectional area gradually increasing along a extending direction of the second fins.

16. The light emitting diode lamp of claim 14, wherein the second fins have a length greater than that of the first fins.

17. The light emitting diode lamp of claim 14, wherein the second heat sink is made of copper, and the first heat sink is made of aluminum.

* * * * *